United States Patent [19]

Moslehi

[11] Patent Number: 5,354,443
[45] Date of Patent: Oct. 11, 1994

[54] METHOD AND APPARATUS FOR PHYSICAL-VAPOR DEPOSITION OF MATERIAL LAYERS

[75] Inventor: Mehrdad M. Moslehi, Dallas, Tex.

[73] Assignee: Texas Instruments Incorporated, Dallas, Tex.

[21] Appl. No.: 187,777

[22] Filed: Jan. 26, 1994

Related U.S. Application Data

[63] Continuation of Ser. No. 923,193, Jul. 31, 1992, abandoned.

[51] Int. Cl.⁵ .................... C23C 14/34; C23C 14/35
[52] U.S. Cl. .................... 204/192.12; 204/298.16; 204/298.19; 204/298.2; 204/298.17
[58] Field of Search ............ 204/192.12, 298.16, 204/298.17, 298.19, 298.2

[56] References Cited

U.S. PATENT DOCUMENTS

| | | | |
|---|---|---|---|
| 4,610,770 | 9/1986 | Saito et al. | 204/192.1 |
| 4,990,229 | 2/1991 | Campbell et al. | 204/298.06 |
| 4,996,077 | 2/1991 | Moslehi et al. | 427/562 |
| 5,006,219 | 4/1991 | Latz et al. | 204/298.16 |
| 5,230,784 | 7/1993 | Yoshida | 204/298.19 |
| 5,232,569 | 8/1993 | Nelson et al. | 204/192.15 |

FOREIGN PATENT DOCUMENTS 61-227168  10/1986  Japan ..................... 204/298.16

*Primary Examiner*—Aaron Weisstuch
*Attorney, Agent, or Firm*—Jacqueline J. Garner; Richard L. Donaldson; William E. Hiller

[57] ABSTRACT

An apparatus for physical-vapor deposition of material layers includes a distributed electron cyclotron resonance (ECR) plasma processing device (12) having a process chamber (14) and a plasma formation region (18). A magnetron target stage (19) connects to a sputtering target material (20) in fluid communication with the process chamber (14) and with the plasma formation region (18) and substantially within the line of sight or view angle of a semiconductor substrate (16). The magnetron target stage (19) induces particles to separate from the sputtering target material (20) and move into the process chamber (14) for subsequent deposition onto the semiconductor substrate (16).

24 Claims, 3 Drawing Sheets

METHOD AND APPARATUS FOR PHYSICAL-VAPOR DEPOSITION OF MATERIAL LAYERS

This application is a continuation, of patent application Ser. No. 07/923,193, filed Jul. 31, 1992, now abandoned.

TECHNICAL FIELD OF THE INVENTION

The present invention relates in general to semiconductor device fabrication processes and more particularly to a method and apparatus for physical-vapor deposition of material layers.

BACKGROUND OF THE INVENTION

Physical-vapor deposition of thin films onto semiconductor wafers is widely used in the fabrication of microelectronics devices. Generally, physical-vapor deposition, or sputter deposition, requires the removal of particles of a sputtering target material and the deposition of those particles onto a semiconductor wafer, thereby forming a thin film of the sputtering target material on the surface of the semiconductor wafer.

There is disclosed in the prior art the use of an electron cyclotron resonance (ECR) plasma device to deposit a thin film of sputtering target material onto a workpiece such as a semiconductor wafer. A disadvantage of the prior art ECR plasma device is constricted access from the target material to the semiconductor substrate. A further disadvantage is a lack of deposition uniformity and an inability to have large sputtering target material surface areas. Previous deposition techniques required a specific configuration of the sputtering target material in order to obtain uniform deposition onto the semiconductor substrate.

From the foregoing, it may be appreciated that a need has arisen for a method and apparatus for physical-vapor deposition that allows complete line of sight access between the sputtering target material and the semiconductor substrate. A need has also arisen to improve and control uniformity and rate of deposition in a physical-vapor deposition process. Further, a need has arisen to increase the size of the sputtering target material and the semiconductor substrate in a physical-vapor deposition environment.

SUMMARY OF THE INVENTION

In accordance with the present invention, a method and apparatus for physical-vapor deposition of material layers are provided which substantially eliminate or reduce disadvantages and problems associated with prior physical-vapor deposition techniques.

According to one embodiment of the present invention, there is provided an apparatus for physical-vapor deposition, or sputter deposition, which includes a distributed electron cyclotron resonance (ECR) plasma processing device having a process chamber and an ECR plasma formation region. A target stage connects to the plasma processing device to place a sputtering target material in fluid communication with the process chamber and with the plasma formation region and substantially in a line of sight of a semiconductor substrate within the plasma processing equipment. The target stage has the ability to induce particles to separate from the sputtering target material and move into the process chamber for subsequent deposition onto the semiconductor substrate.

The present invention provides various technical advantages over physical-vapor deposition techniques within the prior art. For example, one technical advantage is in having a substantially clear line of sight between the sputtering target material and the semiconductor substrate. Another technical advantage is in implementing a larger sputtering target material and a larger semiconductor substrate for deposition than in prior art techniques. Yet another technical advantage is the ability to adjust deposition rate and uniformity across the semiconductor substrate, thus eliminating the deposition non-uniformity problems present in existing physical-vapor deposition processes. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
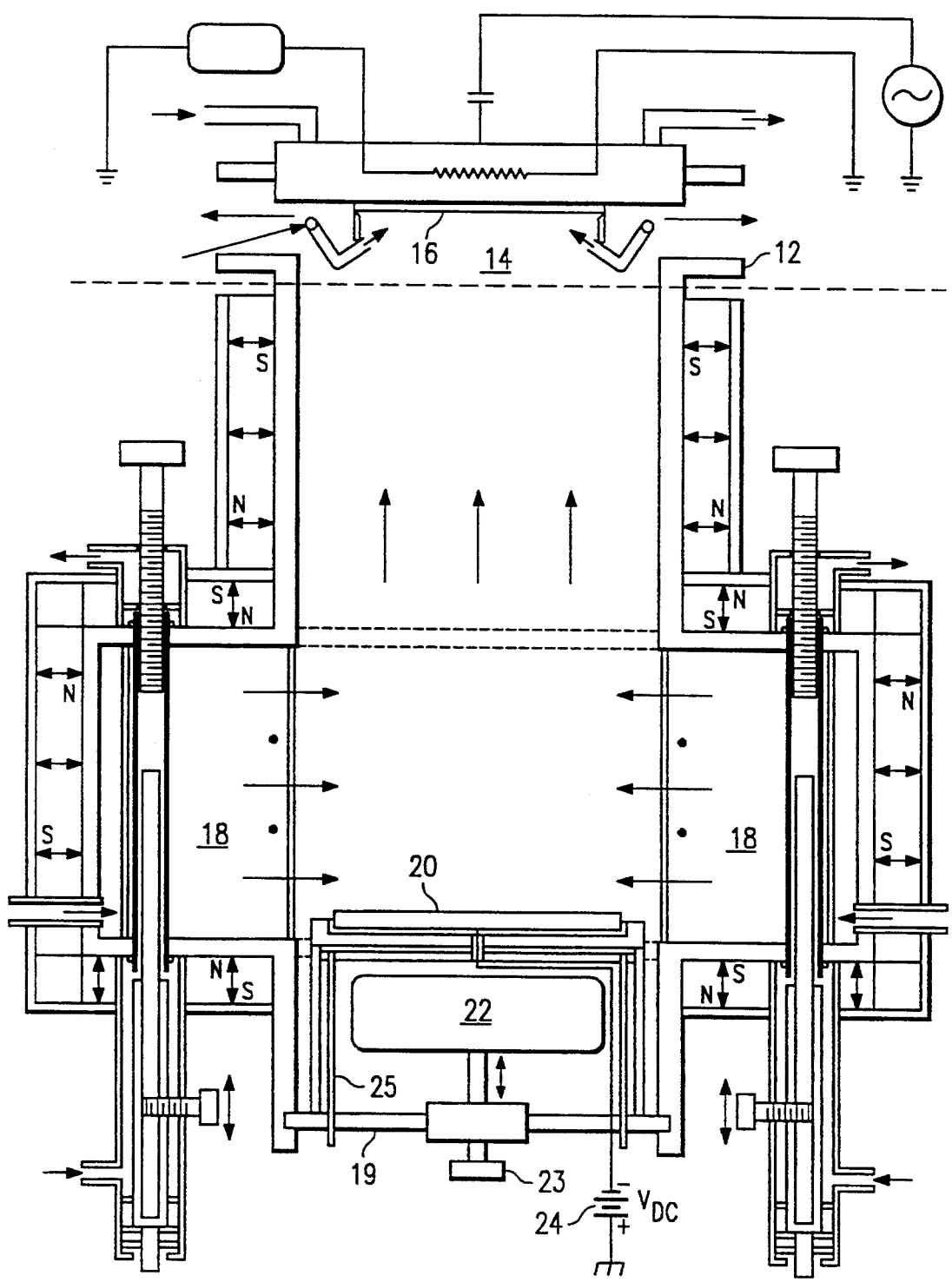
FIG. 1 illustrates an apparatus for ECR-assisted physical-vapor deposition.

FIG. 1 illustrates an apparatus 10 for physical-vapor deposition of material layers according to the present invention. Apparatus 10 includes a distributed electron cyclotron resonance (ECR) plasma processing device 12 having a process chamber 14, a semiconductor substrate 16 inside process chamber 14, and plasma formation regions 18. A target stage 19 lies within plasma processing device 12. A sputtering target material 20 on target stage 19 lies in fluid communication with process chamber 14 and plasma formation regions 18 and is substantially within a line of sight or view angle of semiconductor substrate 16. Target stage 19 also includes a magnetron process energy source module 22 connecting to target stage 19 by an adjustable post 23. A DC or radio frequency voltage source 24 connects to sputtering target material 20. A pipe 25 connects to and traverses through target stage 19 for liquid cooling purposes.

In operation, distributed ECR plasma processing device 12 functions as described in U.S. Pat. No. 4,996,077, issued Feb. 26, 1991 to Moslehi, et al., which is incorporated herein by reference. In the present invention, a gas, either an inert gas such as argon or a reactive gas such as nitrogen or oxygen, enters plasma formation regions 18 and becomes ionized, thereby producing a plasma. The plasma moves in a direction indicated by arrows shown in FIG. 1 and ultimately interacts with both sputtering target material 20 and semiconductor substrate 16. Magnetron process energy source module 22 and voltage source 24 operate on sputtering target material 20, in conjunction with the ECR plasma, to produce an $\overline{E} \times \overline{B}$ electromagnetic field at a surface of sputtering target material 20 necessary to cause separation of target particles from sputtering target material 20. Particles of sputtering target material 20 separate and move into the plasma generated within plasma formation regions 18 through drift and diffusion.

Once within the plasma, the target particles are guided to the surface of semiconductor substrate 16 and deposit onto semiconductor substrate 16 in a thin film form. Target stage 19 keeps cool by introducing a fluid into inlet pipe 25.

The thickness of the sputtered film and the rate of sputter deposition can be controlled by altering characteristics of the plasma, characteristics of magnetron process energy source module 22, and voltage applied to sputtering target material 20 by voltage source 24. U.S. Pat. No. 5,082,542, issued Jan. 21, 1992 to Moslehi, et al., discloses an example of a magnetron process energy source module and is incorporated herein by reference. The strength of the $\overline{E} \times \overline{B}$ field on the surface of sputtering target material 20 varies depending on the voltage applied by voltage source 24 and position of magnetron process energy source module 22 within target stage 19 with respect to sputtering target material 20. Post 23 adjusts a distance between magnetron process energy source module 22 and sputtering target material 20 to control the $\overline{E} \times \overline{B}$ field at the surface of sputtering target material 20 and the rate of target sputtering. In the embodiment of FIG. 1, sputtering target material 20 can be in the form of a thin circular wafer on target stage 19.

Figure 2:
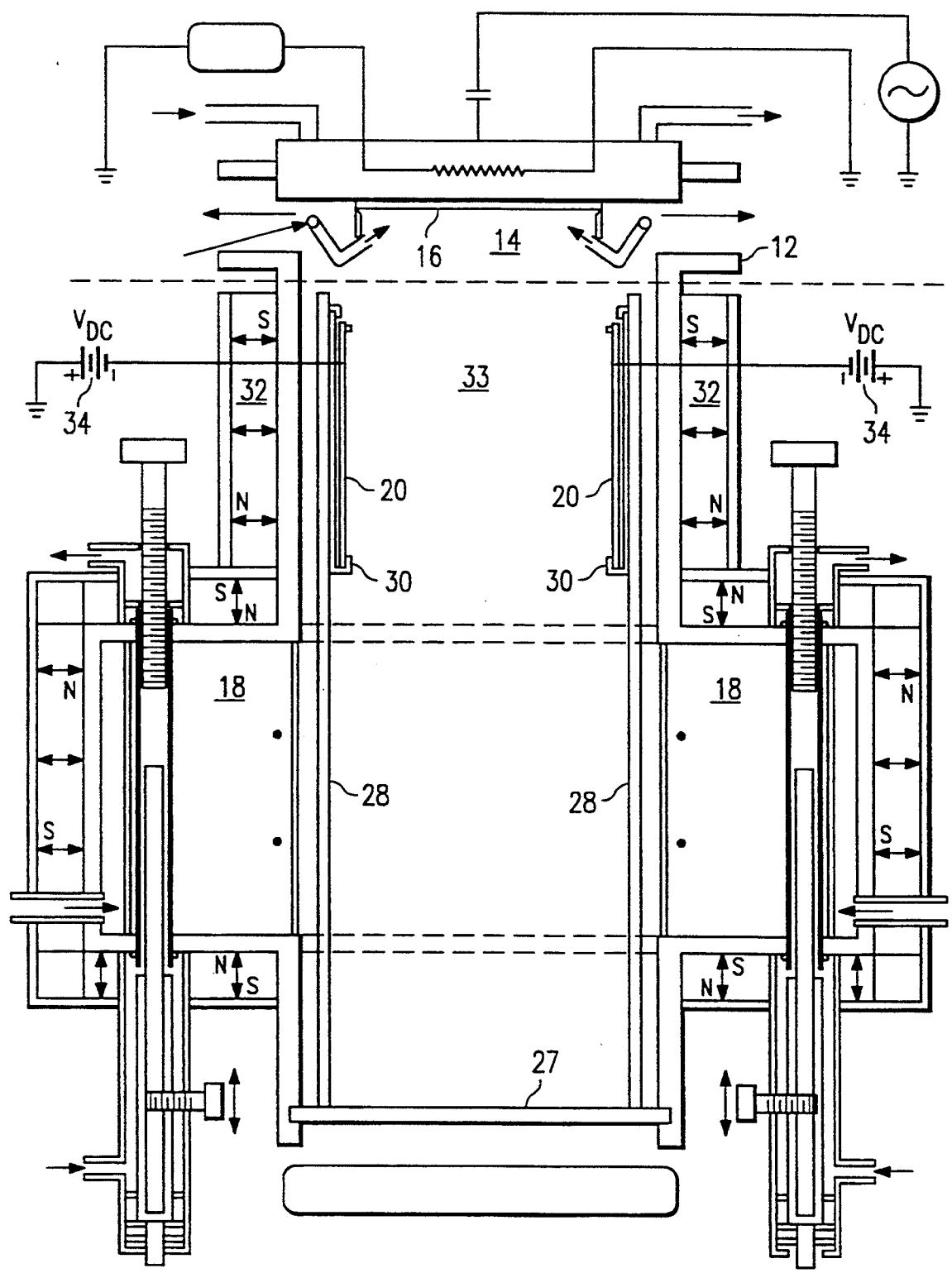
FIG. 2 illustrates an alternate embodiment of an apparatus for ECR-assisted physical-vapor deposition.

FIG. 2 illustrates an apparatus 11 for physical-vapor deposition according to another embodiment of the present invention. This embodiment includes a distributed ECR plasma processing device 12 as described above. In the embodiment of FIG. 2, a sapphire or quartz window 27 replaces target stage 19 of FIG. 1 at ECR plasma processing device 12. Quartz or ceramic rods 28 support cylindrical sputtering target material 20 by quartz or ceramic holders 30 near a wall of distributed ECR remote plasma processing device 12 and within a magnetic field of multipolar magnets 32 around plasma transfer chamber 33. A DC or radio frequency voltage source 34 connects to sputtering target material 20.

In operation, ECR plasma processing device 12 operates as described in U.S. Pat. No. 4,996,077 previously referenced above. Multipolar magnets 32 and voltage source 34 produce an $\overline{E} \times \overline{B}$ field necessary to cause separation of particles from sputtering target material 20 into plasma transfer chamber 33 As described above, the $\overline{E} \times \overline{B}$ field and the plasma generated within plasma processing device 12 cause particles of sputtering target material 20 to separate into the plasma. The particles of the target material are guided to a surface of semiconductor substrate 16 depositing a thin film of sputtering target material 20 onto semiconductor substrate 16 within process chamber 14.

Figure 3:
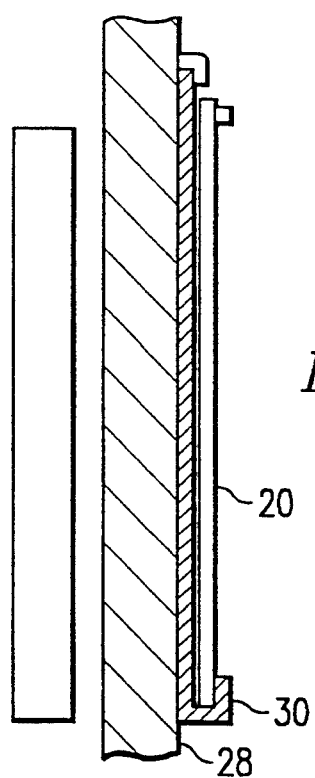
FIG. 3 illustrates a structure for holding the sputtering target material in the embodiment of FIG. 2.

FIG. 3 shows a closeup view of quartz or ceramic rods 28 and quartz or ceramic holders 30 in the embodiment of FIG. 2. As shown in FIG. 3, cylindrical sputtering target material 20 is supported by a quartz holder 30 attached to a quartz rod 28. The quartz rod 28 sits just inside the wall of the ECR plasma processing device 12 near multipolar magnets 32. A DC or radio frequency voltage source 34 is applied to sputtering target material 20 to produce the $\overline{E} \times \overline{B}$ electromagnetic field in conjunction with multipolar magnets 32. Sputtering target material 20 may be formed as a hollow cylindrical structure or as a series of bars spaced and positioned within plasma processing device 12 in a vicinity of multipolar magnets 32 and may comprise various forms of metals as well as other materials.

In summary, physical-vapor deposition onto a semiconductor substrate may occur within a plasma processing device by creating an $\overline{E} \times \overline{B}$ field on the surface of a sputtering target material and allowing plasma to interact with the sputtering target material to dislodge particles from the sputtering target material and deposit the particles onto the semiconductor substrate. Uniformity and rate of deposition are controlled by varying the electromagnetic field on the surface of the sputtering target material and by adjusting the ECR plasma and process parameters. The ECR sputtering apparatus of this invention can be used for both inert and reactive sputtering applications on semiconductor substrates as well as other types of substrate materials.

Thus, it is apparent that there has been provided in accordance with the present invention, a method and apparatus for physical-vapor deposition of material layers that satisfies the advantages set forth above. Although the preferred embodiment has been described in detail, it should be understood that various changes, substitutions and alterations can be made herein without departing from the spirit and scope of the invention as defined by the following claims.

What is claimed is:

1. An apparatus for physical-vapor deposition of material layers, comprising:
   a distributed electron-cyclotron resonance microwave plasma processing device having a process chamber and a plasma formation region spaced apart from said process chamber; and
   a target stage connected to said plasma processing device to place a sputtering target material in fluid communication with said process chamber and said plasma formation region and substantially in a line of sight with a location for a semiconductor substrate within said plasma processing device, said distributed electron cyclotron resonance device providing at least a radially inwardly directed plasma flow over said target stage operable to induce particles to separate from said sputtering target material.

2. The apparatus of claim 1, wherein said target stage includes a magnet.

3. The apparatus of claim 2, wherein said magnet is a magnetron process energy source module.

4. The apparatus of claim 2, wherein said magnet is a plurality of control multipolar magnets within said plasma processing device between said process chamber and said plasma formation region.

5. The apparatus of claim 2, wherein said target stage includes a voltage source to connect to said sputtering target material.

6. The apparatus of claim 5, wherein said magnet and said voltage source generate an electromagnetic field at a location for said sputtering target material so as to separate particles from said sputtering target material.

7. The apparatus of claim 6, wherein said voltage source adjusts a voltage applied to said sputtering target material to control said separation of said particles from said sputtering target material.

8. The apparatus of claim 6, wherein said target stage includes an adjustment pin to vary a distance between said magnet and a location for said sputtering target material to control said separation of said particles from said sputtering target material.

9. The apparatus of claim 4, wherein said target stage includes support members to place said sputtering target material within a magnetic field of said control magnets.

10. The apparatus of claim 9, wherein said support members are made of quartz.

11. The apparatus of claim 9, wherein said support members are made of a ceramic material.

12. The apparatus of claim 1, wherein said target stage generates an electromagnetic field at a location from said sputtering target material to separate particles from said sputtering target material.

13. The apparatus of claim 12, wherein said target stage varies said electromagnetic field to control said separation of said particles from said sputtering target material.

14. An apparatus for physical-vapor deposition of material layers, comprising:
   a distributed electron cyclotron resonance ECR microwave plasma processing device having a process chamber and a plasma formation region;
   a target stage connected to said plasma processing device, said target stage having a sputtering target material in fluid communication with said process chamber and said plasma formation region and substantially in a line of sight with a location for a semiconductor substrate within said plasma processing device, said target stage having a voltage source connected to said sputtering target material, said target stage having a magnet to generate an electromagnetic field in conjunction with said voltage source at a surface of said sputtering target material, wherein a radially inwardly directed plasma from said distributed ECR plasma device induces particles to separate from said sputtering target material, said particles move into plasma formed in said plasma formation region, and said plasma deposits said particles onto a semiconductor substrate within said process chamber.

15. The apparatus of claim 14, wherein said magnet is a magnetron process energy source module.

16. The apparatus of claim 14, wherein said target stage varies said electromagnetic field to control separation of said particles from said sputtering target material.

17. The apparatus of claim 14, wherein said electromagnetic field is varied by adjusting a distance of said magnet from said sputtering target material.

18. The apparatus of claim 14, wherein said electromagnetic field is varied by adjusting a voltage supplied by said voltage source.

19. A method of physical-vapor deposition of material layers, comprising the steps of:
   providing a distributed electron cyclotron resonance microwave plasma processing device;
   placing a sputtering target material in fluid communication with a plasma formation region and a process chamber of said device and substantially in a line of sight of a location for a semiconductor substrate within said process chamber;
   forming a distributed electron cyclotron resonance plasma in said plasma formation region by applying microwave energy;
   introducing said plasma in a radially inwardly facing direction around the edges of said sputtering target material; and
   creating an electromagnetic field at a surface of said sputtering target material, wherein said electromagnetic field induces particles to separate from said sputtering target material, said particles move into said plasma, said plasma deposits said particles onto a semiconductor substrate.

20. The method of claim 17, wherein said creating step includes placing a magnet in close proximity of said sputtering target material such that said sputtering target material is within a magnetic field of said magnet.

21. The method of claim 20, wherein said creating step includes applying a voltage to said sputtering target material.

22. The method of claim 21, further comprising the step of:
   varying a strength of said magnetic field to control separation of said particles from said sputtering target material.

23. The method of claim 22, wherein said varying step includes adjusting a distance of said magnet from said sputtering target material.

24. The method of claim 22, wherein said varying step includes adjusting said voltage applied to said sputtering target material.

* * * * *